(12) United States Patent
Wang et al.

(10) Patent No.: US 12,112,964 B2
(45) Date of Patent: Oct. 8, 2024

(54) CHIP CARRIER, CHIP TESTING MODULE, AND CHIP HANDLING MODULE

(71) Applicants: Sheng-Hung Wang, Taoyuan (TW); Po-Hsiang Chang, Taoyuan (TW); Zhe-Min Liao, Taoyuan (TW)

(72) Inventors: Sheng-Hung Wang, Taoyuan (TW); Po-Hsiang Chang, Taoyuan (TW); Zhe-Min Liao, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 141 days.

(21) Appl. No.: 17/679,158

(22) Filed: Feb. 24, 2022

(65) Prior Publication Data
US 2022/0277976 A1    Sep. 1, 2022

(30) Foreign Application Priority Data
Feb. 26, 2021 (TW) ................. 110107194

(51) Int. Cl.
*H01L 21/673* (2006.01)
*B25J 15/06* (2006.01)
*G01R 31/28* (2006.01)

(52) U.S. Cl.
CPC .... *H01L 21/67333* (2013.01); *B25J 15/0616* (2013.01); *G01R 31/2874* (2013.01); *G01R 31/2893* (2013.01)

(58) Field of Classification Search
CPC .... G01R 31/26; G01R 31/28; G01R 31/2863; G01R 31/2867; G01R 31/2874; G01R 31/2893; B25J 15/06; B25J 15/0616; H01L 21/673; H01L 21/67333; H01L 21/6838; H01L 2924/00; H01L 2924/0002; H01L 21/67242; H01L 21/50; H01L 21/68; H01L 21/683; H01L 21/687; H01L 22/20; H01L 2221/683; H01L 2223/54473; H01L 23/04; H01L 23/473; H01L 23/544; H01L 25/0655; H01L 2924/014; H01L 2924/15311; H01L 2924/16153; H01L 2924/1616; H01L 2924/166; H01L 21/67712; H01L 21/67784; B65G 2249/045; B65G 47/911; B65G 49/065; B65G 51/03
(Continued)

(56) References Cited

FOREIGN PATENT DOCUMENTS

JP    2016148574 A  *  8/2016  ............. G01R 31/26
KR    101218578 B1  *  1/2013  ............. H01L 21/58

OTHER PUBLICATIONS

English translation JP2016148574A Electronic Component Carrier Device and Electronic Component Inspection Apparatus (Year: 2016).*
(Continued)

*Primary Examiner* — Eman A Alkafawi
*Assistant Examiner* — Courtney G McDonnough

(57) ABSTRACT

The invention provides a chip carrier, a chip testing module and a chip handling module. The chip carrier for carrying a plurality of chips comprises a main body with an upper surface and a lower surface. The main body has a plurality of air guide holes, and two ends of each air guide hole are respectively exposed on the upper surface and the lower surface. A part of the air guide holes are defined as a first group, and the air guide holes of the first group are connected. The main body is made of conductive material.

7 Claims, 8 Drawing Sheets

(58) Field of Classification Search
USPC .......................................................... 324/723
See application file for complete search history.

(56) References Cited

OTHER PUBLICATIONS

English translation KR101218578B1 Carrier Plate for Holding Chips and Method for Manufacturing the Same (Year: 2013).*

* cited by examiner

CHIP CARRIER, CHIP TESTING MODULE, AND CHIP HANDLING MODULE

CROSS REFERENCE TO RELATED APPLICATION

The present application claims priority to Taiwan patent application Serial No. 110107194 filed on Feb. 26, 2021, the entire content of which is incorporated by reference to this application.

BACKGROUND OF THE INVENTION

1. Field of the Invention

The present invention pertains to a chip carrier, a chip testing module, and a chip handling module, more specifically to a chip carrier which can carry multiple chips, a chip testing module which can test multiple chips, and a chip handling module which can transport multiple chips.

2. Description of the Prior Art

A series of tests are often required to ensure quality of fabricated chips. Since each test needs to be performed in its corresponding test station, that the chips need to be transported between the test stations. For example, the chip is generally picked up by a nozzle when the chip needs to move to the next test station, and then the nozzle can release the chip after the chip is aligned. However, person having ordinary skill in the art can understand that moving the chips one by one is a very time-consuming task and is proportional to the number of the tests need to be performed on the chips. In particular, as the chips are getting smaller and smaller, repeatedly picking up and releasing the chips will also increase the chance of damaging the chips.

Accordingly, the industry needs a new chip carrier which is capable of carrying multiple chips at the same time, thereby improving the chip handling efficiency and reducing the chance of the chips being contacted directly. In addition, the industry also needs a new chip testing module and a new chip handling module for testing multiple chips in the chip carrier and transporting the chip carrier.

SUMMARY OF THE INVENTION

The present invention provides a chip carrier which can carry a plurality of chips at the same time, thereby realizing the purpose of transporting chips in batches. The chip carrier also can be directly transported by a chip handling module, thereby avoiding repeatedly picking up and releasing the chips and reducing the chance of damaging chips. In addition, the chip carrier can be conductive and can directly control whether to power the chips, so that the chip carrier can reduce the chance of the chips being contacted directly.

The present invention discloses a chip carrier for carrying a plurality of chips comprising a main body with an upper surface and a lower surface. The main body has a plurality of air guide holes, and two ends of each air guide hole are respectively exposed on the upper surface and the lower surface. A part of the air guide holes are defined as a first group, and the air guide holes of the first group are connected. The main body is made of conductive material.

In some embodiments, the main body may have a first trench, and the first trench is used to connect with the air guide holes of the first group. The first recess may be exposed on the lower surface. In addition, the main body may have a first positioning hole and a second positioning hole, the first positioning hole and the second positioning hole are exposed on the lower surface, and the first recess is formed between the first positioning hole and the second positioning hole. Besides, a plurality of accommodating positions are defined on the upper surface, each of the accommodating positions may have one of the air guide holes, and each of the accommodating positions may be corresponded to one of the chips. When one of the accommodating positions accommodates the corresponding chip, the chip may cover the air guide hole within the accommodating position. Moreover, the main body may be provided with a first upper guide groove and a second upper guide groove, the first upper guide groove and the second upper guide groove may be exposed on the upper surface, and the accommodating positions may be located between the first upper guide groove and the second upper guide groove. Each of the accommodating positions may be a recess, and the recess encircles one of the air guide holes.

The present invention provides a chip testing module which can fix a chip carrier, and can control whether to suck a chip in a specific accommodating position on the chip carrier. In addition, the chip testing module can also be electrically connected to the chip on the chip carrier, and use the heat conducting block to transmit the thermal energy of the chip carrier.

The present invention provides a chip testing module comprising a heat conducting block and a heat sink body. The heat conducting block is provided with a plurality of air extraction pipelines. The heat sink body, disposed on the heat conducting block and adjacent to an edge of the heat conducting block, has an upper surface provided with a first positioning column, a second positioning column, a first air extraction hole, and a second air extraction hole. The first air extraction hole and the second air extraction hole are located between the first positioning column and the second positioning column, the second air extraction hole is located in a vacuum guide groove exposed on the upper surface And, the first air extraction hole and the second air extraction hole are respectively connected to one of the air extraction pipelines, and the first air extraction hole is not coplanar with the second air extraction hole.

In some embodiments, when a chip carrier is installed on the heat sink body, the first positioning column and the second positioning column may be respectively corresponding to a first positioning hole and a second positioning hole of the chip carrier. Besides, when a chip carrier is installed on the heat sink body, the first air extraction hole may be connected to at least one air guide hole of the chip carrier, and the second air extraction hole may suck the chip carrier.

The present invention provides a chip handling module, which can transport a chip carrier, thereby reducing the circumstances that individual chips are directly touched and moved. In addition, when the chip handling module transports the chip carrier, the chip handling module can use pins to immobilize a plurality of chips on the chip carrier, thereby preventing the chips from sliding or falling.

The present invention provides a chip handling module comprising a nozzle body having a bottom surface which is provided with a first protruding portion and a second protruding portion. The first protruding portion is provided with a third air extraction hole, and the second protruding portion is provided with a fourth air extraction hole, and the top surface of the first protruding portion is coplanar with the top surface of the second protruding portion. When the nozzle body sucks a chip carrier, a first air chamber is formed between the first protruding portion and the chip carrier, a second air chamber is formed between the second protruding portion and the chip carrier, and the air pressures in both of the first air chamber and the second air chamber are less than an ambient air pressure.

In some embodiments, the chip handling module may further comprise a plurality of pins located between the first protruding portion and the second protruding portion, and each pin corresponds to one of a plurality of accommodating positions of the chip carrier. The third air extraction hole and the fourth air extraction hole may suck the chip carrier, and when the nozzle body sucks the chip carrier, each pin may press a chip to immobilize the chip at the corresponding accommodating position. The top surface of the first protruding portion may have a first suction recess, and the top surface of the second protruding portion may have a second suction recess, when the nozzle body sucks the chip carrier, the first air chamber is formed between the first suction recess and the chip carrier, and the second air chamber is formed between the second suction recess and the chip carrier.

To sum up, the chip carrier provided by the present invention can carry multiple chips at the same time, and the chips can be moved between various test stations by using the chip carrier, thereby improving the efficiency of transporting the chips and reducing the chance of contacting the chips directly. In addition, the chip testing module can not only fix the chip carrier, but also independently control whether to suck a specific chip on the chip carrier. The chip testing module can be electrically connected to the chip on the chip carrier, and the thermal energy of the chip carrier can be derived by using the heat conducting block. Besides, the chip handling module can suck and transport the chip carrier, and reduce the circumstances that individual chips are directly touched and moved. And, the chip handling module can use the pins to immobilize multiple chips on the chip carrier while transporting the chip carrier, thereby preventing the chips from sliding or falling.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
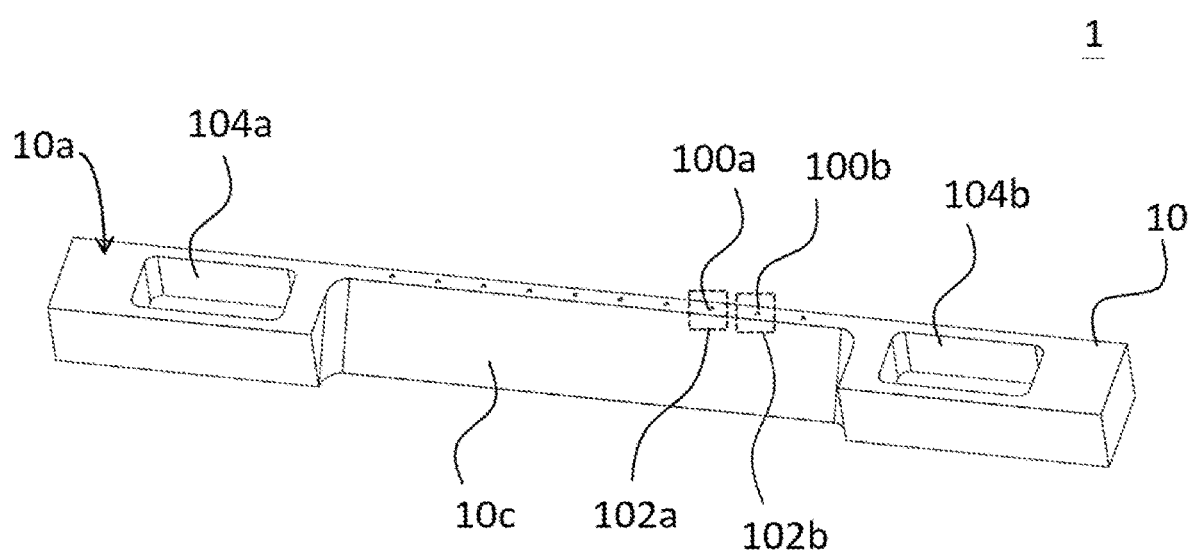
FIG. 1 is a stereoscopic diagram illustrating a chip carrier from a stereoscopic view according to an embodiment of the present invention.
Figure 2:
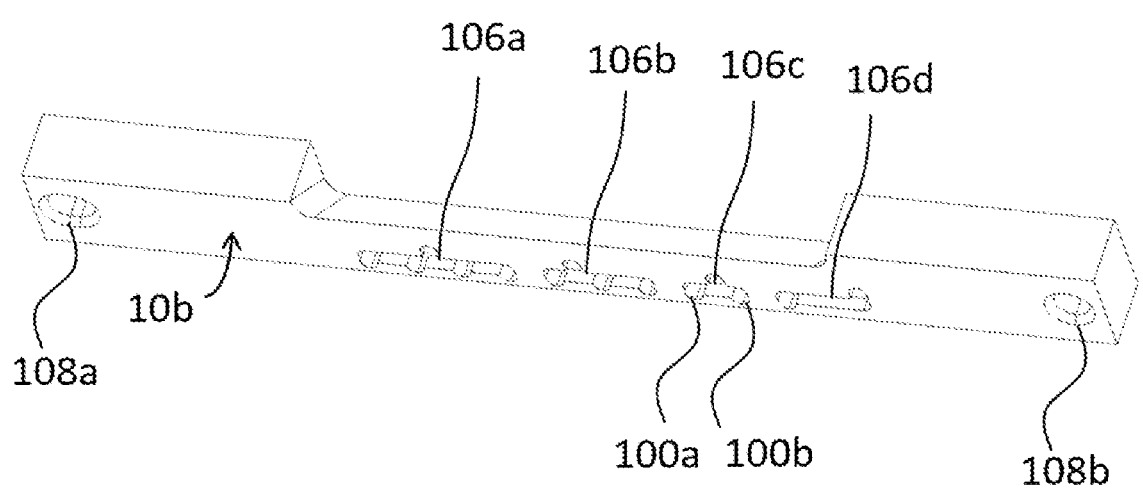
FIG. 2 is another stereoscopic diagram illustrating the chip carrier according to an embodiment of the present invention.
Figure 3:
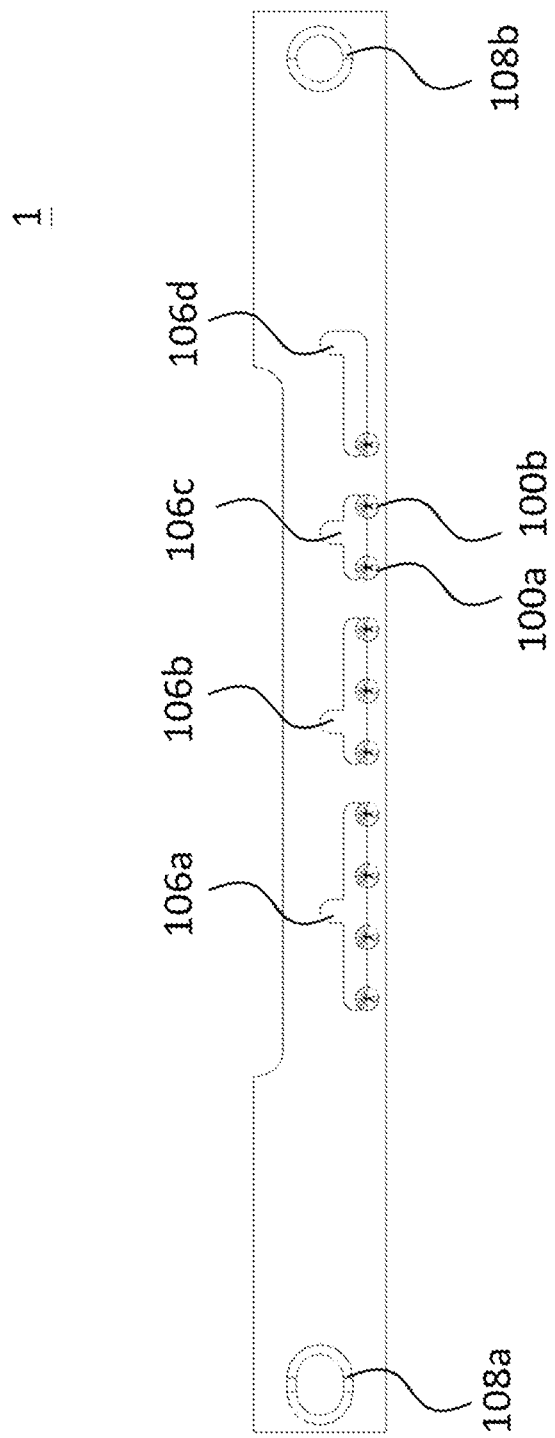
FIG. 3 is a bottom view of the chip carrier according to an embodiment of the present invention.

Please refer to FIG. 1, FIG. 2 and FIG. 3 together. FIG. 1 is a stereoscopic diagram illustrating a chip carrier from a stereoscopic view according to an embodiment of the present invention. FIG. 2 is another stereoscopic diagram illustrating the chip carrier according to an embodiment of the present invention. FIG. 3 is a bottom view of the chip carrier according to an embodiment of the present invention. As shown in the figures, the chip carrier 1 has a main body 10, and an upper surface 10a and a lower surface 10b of the main body 10 may be defined. The upper surface 10a can be used to carry and support a plurality of chips (not shown). It can be seen from the figures that the upper surface 10a has several openings of a plurality of air guide holes, such as adjacent air guide holes 100a and 100b. In practice, a certain area around each air guide hole can be defined as an accommodating position, for example, the surrounding of the air guide hole 100a can be defined as the accommodating position 102a, and the surrounding of the air guide hole 100b can be defined as the accommodating position 102b. In one example, the area size of the accommodating position can just correspond to the size of the chip, that is, the chip is planned to be placed in the accommodating position. In the example shown in FIG. 1, the upper surface 10a shows ten air guide holes, which means that there can be ten accommodating positions, and ten chips can be placed correspondingly. Of course, this embodiment is not intended to limit the number of the air guide holes, the accommodating positions, or the chips that can be placed, and person having ordinary skill in the art can decide the number as needed. In addition, the chip may be, but not limited to, a light emitting chip for emitting laser light.

Structurally, the area of the upper surface 10a of the main body 10 is slightly smaller than the area of the lower surface 10b. Because, the main body 10 can be provided with the inclined surface 10c, and the inclined surface 10c makes the main body 10 appear narrower in the middle of the upper surface 10a and wider in the middle of the lower surface 10b. In one example, the inclined surface 10c is only in the middle of the main body 10, and leaves the upper surface 10a with the area just enough for a plurality of accommodating positions for accommodating the chip. One of the reasons is that the design of the inclined surface 10c can reduce the volume and mass of the main body 10, thereby increasing the thermal conductivity of the main body 10 (or reducing the heat stored in the main body 10). The lower surface 10b is wider can provide the structural strength which is needed for drilling holes in the main body 10. In practice, the holes can be drilled in two steps that a shallower section of the air guide hole 100a can be drilled from the narrower upper surface 10a (with poor structural strength), and a deeper section of the air guide hole 100a can be drilled from the wider lower surface 10b (with better structural strength), and the air guide hole 100a is formed after its two sections are connected. In addition, when a plurality of chips are respectively placed in the corresponding accommodating positions, taking the accommodating position 102a as an example, because the size of the chip is larger than the opening of the air guide hole 100a on the upper surface 10a, the chip should be able to completely cover the opening of the air guide hole 100a on the upper surface 10a. As long as the chip and the upper surface 10a are sufficiently flat, the chip and the upper surface 10a should be in close contact to form an air tightness.

In addition to the air guide holes, the upper surface 10a of the main body 10 may also be provided with a first upper guide groove 104a and a second upper guide groove 104b. In one example, the first upper guide groove 104a and the second upper guide groove 104b do not penetrate through the main body 10, but the first upper guide groove 104a and the second upper guide groove 104b are recessed structures with openings exposed on the upper surface 10a. From the example of FIG. 1, the plurality of accommodating positions and the openings of the plurality of air guide holes on the upper surface 10a are located between the first upper guide groove 104a and the second upper guide groove 104b. On the other hand, the plurality of air guide holes penetrate through the main body 10, so that each air guide hole also has an opening on the lower surface 10b. Taking the air guide hole 100a and the air guide hole 100b described above as an example, it can also be seen in FIG. 2 that the lower surface 10b has openings of the adjacent air guide hole 100a and the air guide hole 100b. The lower surface 10b may also be provided with a plurality of trenches, each trenches can be defined as the first trench, and the function of the trenches is to communicate the air guide holes.

In one example, the plurality of air guide holes in the main body 10 can be divided into two or more groups, such as among the ten air guide holes shown in FIG. 1, the leftmost four air guide holes can be one group, the next three air guide holes can be another group, and the next two air guide holes (which are the air guide hole 100a and the air guide hole 100b) can be further another group, and the rightmost one air guide hole can be the last group. The air guide hole/holes in each of the above groups may be connected by the corresponding trench. For example, there may be, from left to right, trenches 106a to 106d corresponding to the different groups of the air guide holes described above. As shown in the figure of this embodiment, it can be seen that the air guide hole 100a and the air guide hole 100b are connected together by the trench 106c. In one example, the trenches do not have to be exposed on the lower surface 10b, but may also be designed in the main body 10. For example, the trench 106c may communicate with the air guide hole 100a and the air guide hole 100b inside the main body 10.

In order to demonstrate the function of the trench, it is assumed that two chips to be tested are placed at the accommodating position 102a and the accommodating position 102b, respectively. At this time, the two chips should cover the openings of the air guide hole 100a and the air guide hole 100b on the upper surface 10a, and the openings of the air guide hole 100a and the air guide hole 100b on the lower surface 10b can be connected to the external air extraction holes (not shown in FIG. 1-3). When the external air extraction holes begin to extract air, because the trench 106c communicates with the air guide hole 100a and the air guide hole 100b, the air guide hole 100a and the air guide hole 100b will be simultaneously evacuated, so that the two chips are sucked at the accommodating position 102a and the accommodating position 102b. Taking the example shown in FIG. 2, each trench can be a structure recessed from the lower surface 10b, and in addition to connecting the air guide holes in the individual groups, the trench can also be aligned with the external air extraction holes. As shown in FIG. 3, the trench 106c may have a linear recess connecting the air guiding hole 100a and the air guiding hole 100b, the trench 106c may also have a non-fixed shape recess extending from the linear recess, so as to align with the external air extraction hole. The above example can also explain the reason why the trench is needed even if there is only one air guide hole in the group. For example, the rightmost air guide hole in FIG. 3 can be connected to the trench 106d, and the trench 106d can be aligned with the external air extraction hole, so that the air extraction hole can extract air from the rightmost air guide hole through the trench 106d.

Figure 4:
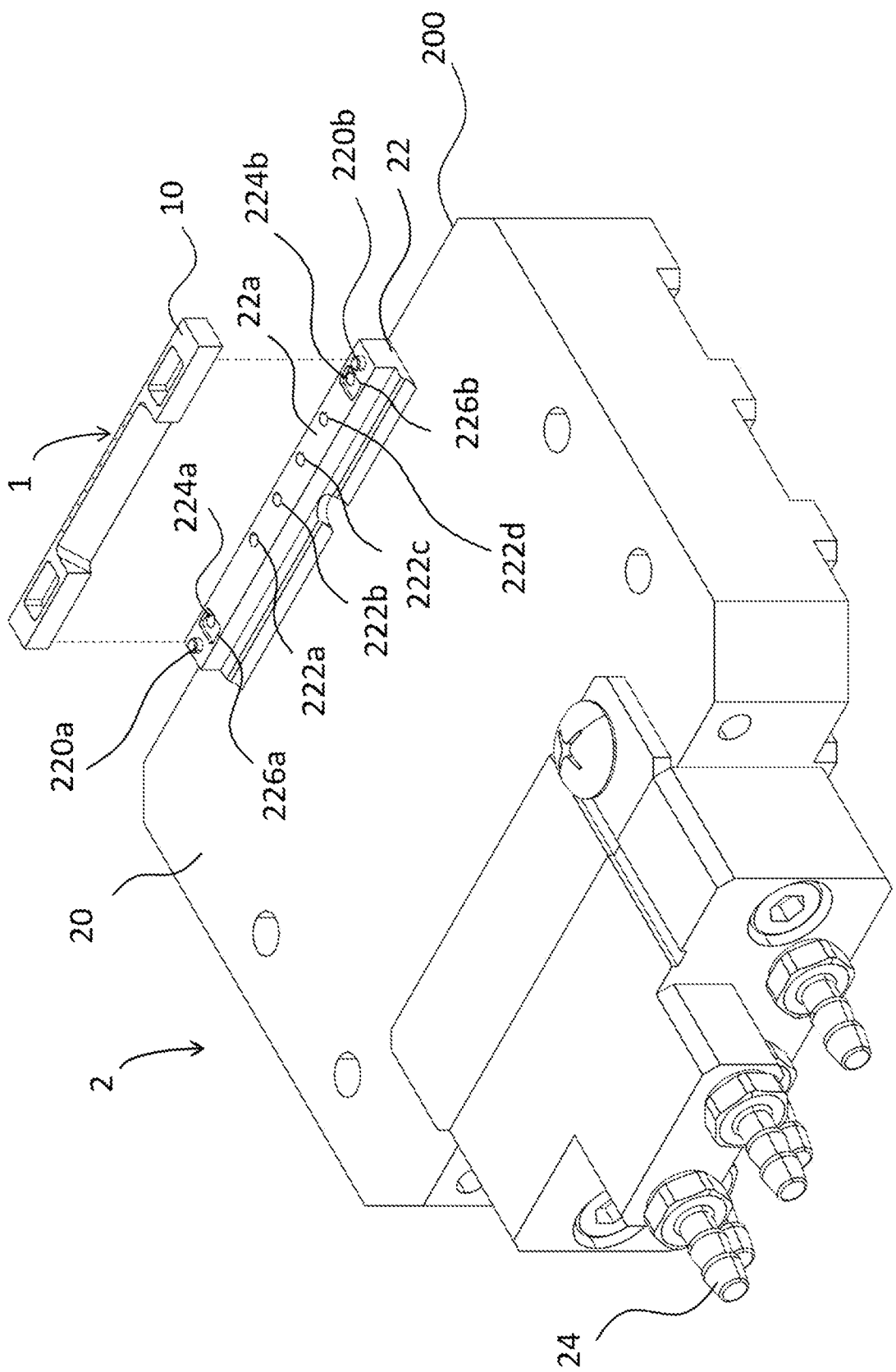
FIG. 4 is a stereoscopic diagram illustrating the chip carrier and the chip testing module according to an embodiment of the present invention.

The main body 10 may further be provided with a first positioning hole 108a and a second positioning hole 108b on the lower surface 10b. The first positioning hole 108a and the second positioning hole 108b may be recessed from the lower surface 10b, and are respectively located at opposite sides of the lower surface 10b. In one example, both the opening and the groove of the air guide hole exposed on the lower surface 10b may be located between the first positioning hole 108a and the second positioning hole 108b. In order to explain the structure and function of the lower surface 10b, please refer to FIG. 3 and FIG. 4 together. FIG. 4 is a stereoscopic diagram illustrating the chip carrier and the chip testing module according to an embodiment of the present invention. As shown in the figures, the chip carrier 1 can be sucked and fixed to the chip testing module 2, and the chip testing module 2 can have a heat conducting block 20 and a heat sink body 22, wherein the heat sink body 22 is mounted on an edge 200 of the heat conducting block 20. The upper surface 22a of the heat sink body 22 may be provided with a first positioning column 220a and a second positioning column 220b, and the first positioning column 220a and the second positioning column 220b may be used to align the first positioning hole 108a and the second positioning hole 108b.

For example, the first positioning column 220a and the second positioning column 220b may respectively be a cylinder, and the first positioning hole 108a and the second positioning hole 108b may respectively be a correspondingly shaped circular or oval recess. The present embodiment does not limit the shapes of the first positioning column 220a, the second positioning column 220b, the first positioning hole 108a, and the second positioning hole 108b, and they are configured to guide the chip carrier 1 to align with the heat sink body 22. In other words, as long as the first positioning column 220a (or the second positioning column 220b) of the chip testing module 2 can be inserted into the first positioning hole 108a (or the second positioning hole 108b) of the chip carrier 1, it shall be within the scope of the positioning column and the positioning hole disclosed in the example. In addition, the shapes of the first positioning holes 108a and the second positioning holes 108b may be different, and the shapes of the first positioning columns 220a and the second positioning columns 220b may also be different, which are not limited in this embodiment.

A first air extraction hole (for example, air extraction holes 222a-222d) and a second air extraction hole (for example, air extraction holes 224a-224b) may be provided between the first positioning column 220a and the second positioning column 220b. The air extraction holes 222a-222d can be the external air extraction holes exemplified in the foregoing embodiments, and their positions correspond to trenches 106a-106d respectively. For example, the air extraction holes 222c correspond to the trench 106c and can be connected to the air guide hole 100a and the air guide hole 100b. In one example, the heat conducting block 20 may be provided with a plurality of air extraction pipelines (not shown) and connected to a plurality of air nozzles 24, and each air extraction hole 222a-222d may correspond to one of the air extraction pipelines. When the air nozzle 24 corresponding to the air extraction hole 222*c* is extracting air, the air guide hole 100*a* and the air guide hole 100*b* connected with the trench 106*c* can simultaneously provide negative pressure, so that the air guide hole 100*a* and the air guide hole 100*b* can tightly suck the chips placed in the accommodating position 102*a* and the accommodating position 102*b* respectively. In other words, when the main body 10 of the chip carrier 1 is placed on the heat sink body 22 of the chip testing module 2, the air extraction holes 222*a*-222*d* are able to suck the chips in the plurality of accommodating positions.

Of course, whether each air nozzle 24 is extracting air can be controlled, that is to say, users can decide which group of the air guide holes in the chip carrier 1 to provide negative pressure by controlling the corresponding air nozzle 24, so that the chips at the corresponding accommodating positions are sucked tightly. Since each group of air guide holes may correspond to different numbers of air guide holes, controlling different air nozzles 24 may also mean controlling different groups and different numbers of chips to be sucked or released. In practice, the user can arrange the placement of the chips in advance. For example, if it is known that three chips are to be removed during the test, the three chips can be arranged in the accommodating positions corresponding to the trench 106*b*. Next, as long as the air nozzle 24 corresponding to the trench 106*b* is controlled to stop pumping/extracting air, the three air guide holes connected to the trench 106*b* can stop providing negative pressure at the same time, so that the three chips in the corresponding three accommodating positions can be released.

In addition, some of the air nozzles 24 may also correspond to the second air extraction holes (for example, air extraction holes 224*a*-224*b*), and the openings of the air extraction holes 224*a* and 224*b* may be located in a vacuum guide groove 226*a* and a vacuum guide groove 226*b*, respectively. The vacuum guide groove 226*a* and the vacuum guide groove 226*b* may be recessed from the upper surface 22*a*, so that the openings of the first air extraction holes (for example, the air extraction holes 222*a*-222*d*) and the second air extraction holes (for example, the air extraction holes 224*a*-224*b*) may not be on the same plane. In practice, the openings of the air extraction holes 222*a*-222*d* are located on the upper surface 22*a*, and the openings of the air extraction holes 224*a*-224*b*, located in the vacuum guide grooves 226*a* and 226*b* recessed from the upper surface 22*a*, are slightly lower than the air extraction holes 222*a*-222*d*. In an example, when the chip carrier 1 is placed on the chip testing module 2, the lower surface 10*b* of the main body 10 will contact the upper surface 22*a* of the heat sink body 22, and the lower surface 10*b* will cover the vacuum guide groove 226*a* and the vacuum guide groove 226*b*. At this time, when the air nozzles 24 corresponding to the air extraction holes 224*a*-224*b* extract air, as long as the lower surface 10*b* and the upper surface 22*a* are sufficiently flat, the vacuum guide groove 226*a* and the vacuum guide groove 226*b* should be airtight. Thereby, the lower surface 10*b* and the vacuum guide groove 226*a* and the vacuum guide groove 226*b* will be in close contact with each other by negative pressure, so that the main body 10 is sucked tightly to the heat sink body 22. It can be seen from the above that when the main body 10 of the chip carrier 1 is placed on the heat sink body 22 of the chip testing module 2, the function of the air extraction holes 224*a*-224*b* is to immobilize the chip carrier 1 and the chip testing module 2, and there is different from the function of the air extraction holes 222*a*-222*d* which is configured to immobilize the chips.

In an example, the main body 10 and the heat sink body 22 of the chip carrier 1 can be made of conductive materials, and, for example, the main body 10 and the heat sink body 22 can respectively be an integrated structure and can be produced by an aluminum extrusion process. Therefore, after the main body 10 and the heat sink body 22 are fixed together (which also means the chip carrier 1 is fixed to the chip testing module 2), the plurality of chips carried by the main body 10 have been electrically connected to the chip testing module 2 via the heat sink body 22, so the test can be started directly without moving or contacting the chip. In addition, the heat conducting block 20 may be a temperature control platform, which can freely adjust the temperature and transmit the thermal energy to the upper heat sink body 22. Person having ordinary skill in the art can understand that the heat conducting block 20 and the heat sink body 22 should have good heat-conducting efficiency. In practice, the main body 10 also has good heat conduction efficiency, so that the operating temperature of the chip carried by the main body 10 can be controlled by the heat conducting block 20. It is worth mentioning that, taking the plurality of chips that can generate laser light as an example, the heat sink body 22 is mounted on the edge 200 of the heat conducting block 20 to facilitate the measurement of the light pattern. For example, a plurality of chips carried by the main body 10 may emit light toward one side of the edge 200 (for example, along the direction parallel to the upper surface 22*a*), and the pattern of the emitted light can be measured outside the heat conducting block 20.

Figure 5:
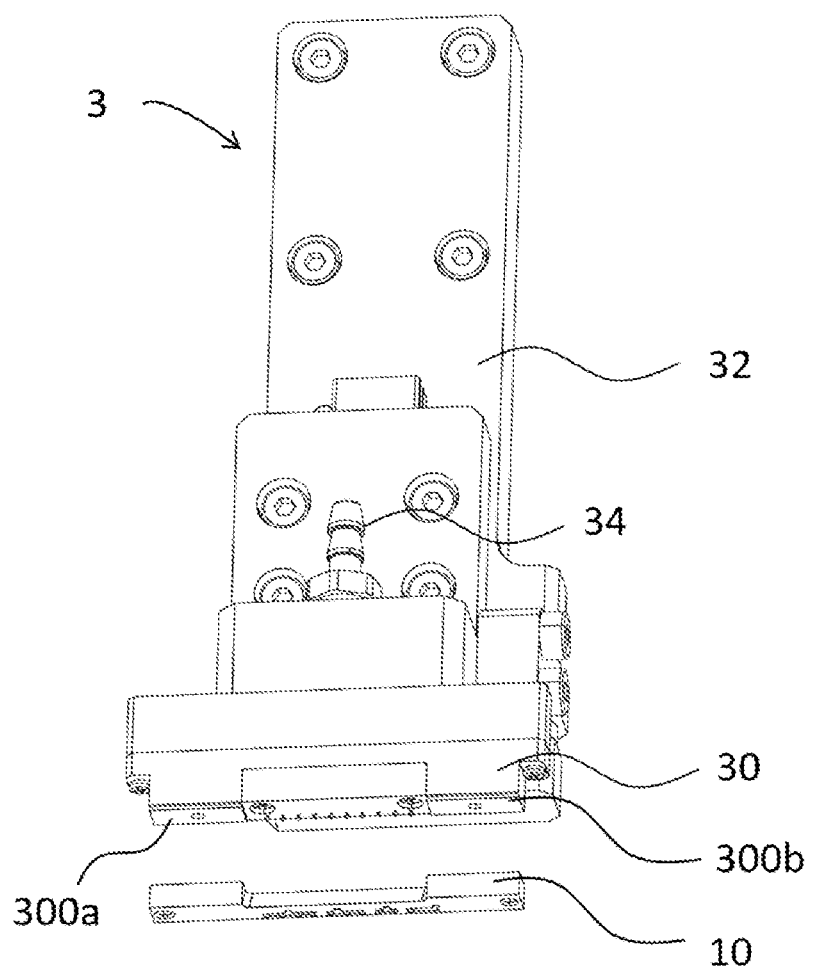
FIG. 5 is a stereoscopic diagram illustrating the chip carrier and the chip handling module according to an embodiment of the present invention.
Figure 6:
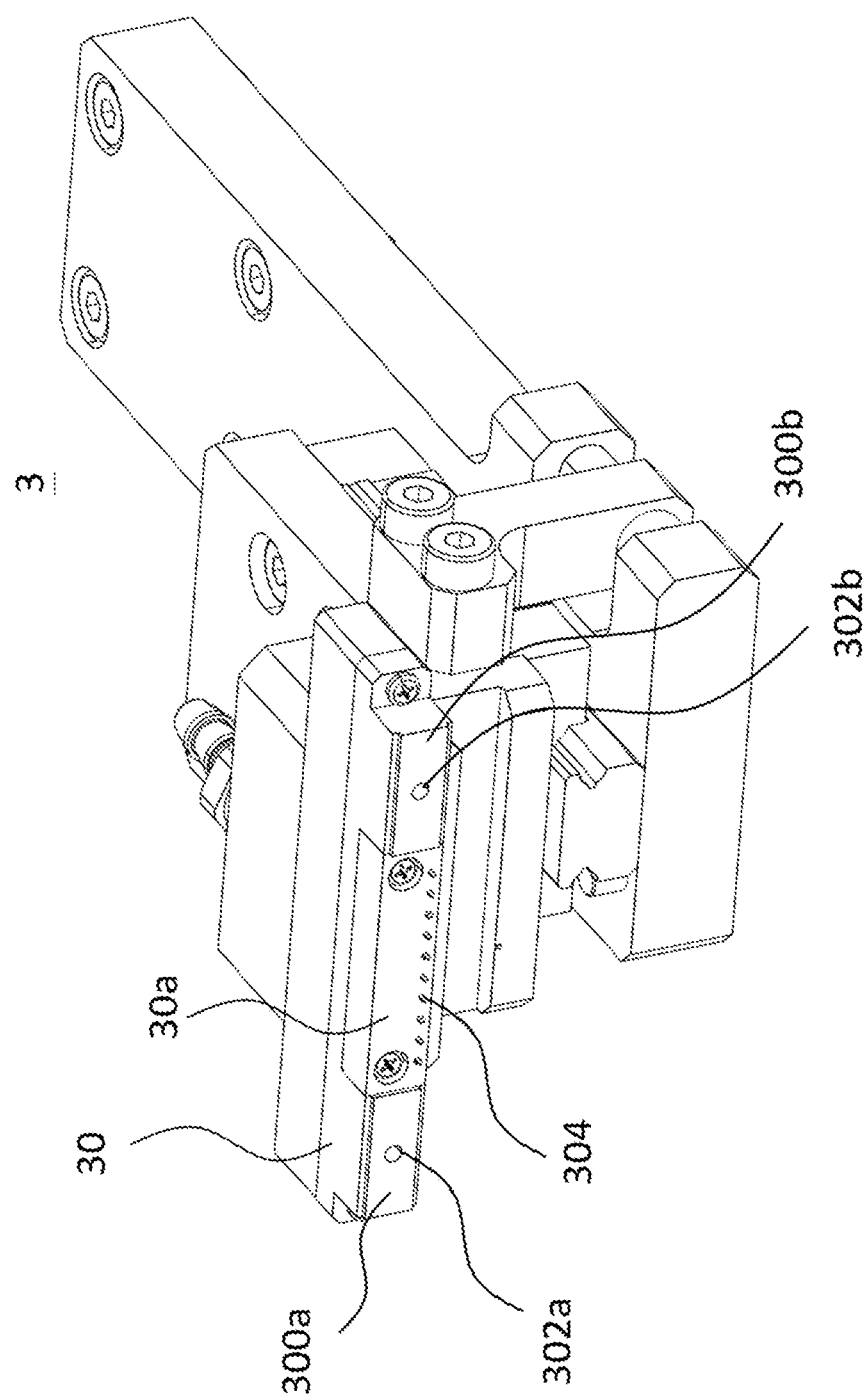
FIG. 6 is a stereoscopic diagram illustrating the chip handling module according to an embodiment of the present invention.

After the test is completed, the chip carrier 1 can be removed from the chip testing module 2 by a chip handling module. Please refer to FIG. 1, FIG. 5 and FIG. 6 together. FIG. 5 is a stereoscopic diagram illustrating the chip carrier and the chip handling module according to an embodiment of the present invention, and FIG. 6 is a stereoscopic diagram illustrating the chip handling module according to an embodiment of the present invention. As shown in the figures, the chip handling module 3 has a nozzle body 30, and the nozzle body 30 may define a bottom surface 30*a*. A first protruding portion 300*a* and a second protruding portion 300*b* are provided on the bottom surface 30*a*. The first protruding portion 300*a* is provided with an air extraction hole 302*a* (third air extraction hole), and the second protruding portion 300*b* is provided with an air extraction hole 302*b* (fourth exhaust hole). In one example, the nozzle body 30 may also be provided with an air extraction pipeline (not shown in the figures), and the air extraction pipeline may communicate with the air nozzle 34 and the air extraction holes 302*a*-302*b*. In practice, it is possible to control whether the air nozzle 34 extracts air or not, the user can control the air nozzle 34 to make the air extraction holes 302*a*-302*b* start to extract air. In addition, the nozzle body 30 can be locked on a fetching equipment 32, and the fetching equipment 32 can be used to connect or be a part of a mechanical arm, and the mechanical arm can be used to move between several chip testing modules 2.

In an example, the nozzle body 30 can be used to suck the main body 10 of the chip carrier 1, and the first protruding portion 300*a* and the second protruding portion 300*b* can be configured to cover the first upper guide groove 104*a* and the second upper guide groove 104*b* on the upper surface 10*a*. Since the upper surface 10*a* is substantially flat, the top surfaces of the first protruding portion 300*a* and the second protruding portion 300*b* are aligned with the upper surface 10*a* to form a coplanar surface. In practice, an air chamber (first air chamber) may be formed between the first upper guide groove 104*a* and the first protruding portion 300*a*, and an air chamber (the second air chamber) may be formed between the second upper guide groove 104b and the second protruding portion 300b. When the air extraction hole 302a extracts air between the first protruding portion 300a and the first upper guide groove 104a, and the air extraction hole 302b extracts air between the second protruding portion 300b and the second upper guide groove 104b, inside the first air chamber and the second air chamber will have negative pressure (having a pressure difference against outside). In this way, the nozzle body 30 can suck the two ends of the main body 10 tightly, and the suction force of the nozzle body 30 to the main body 10 can spread evenly. In addition, a plurality of pins 304 may also be provided on the bottom surface 30a, and the plurality of pins 304 are located between the first protruding portion 300a and the second protruding portion 300b. It can be seen from the figures that the arrangement of the plurality of pins 304 is relatively scattered, and the number and the arrangement of the plurality of pins 304 are related to the number and the arrangement of the accommodating positions on the upper surface 10a.

In an example, after the multiple tests are completed, the air extraction holes 224a-224b will stop extracting air, thereby loosening the chip carrier 1 and the chip testing module 2, and then aligning the nozzle body 30 with the main body 10 of the chip carrier 1. Therefore, the air extraction holes 302a-302b can suck the main body 10. In this embodiment, the chip carrier 1 and the chip handling module 3 can be fixed to each other. At this time, since chips may still be placed in the plurality of accommodating positions of the main body 10, and the air extraction holes 222a-222d are no longer capable of sucking multiple chips after the chip carrier 1 leaves the chip testing module 2, so it is necessary to hold the chip by a plurality of pins 304. For example, each chip is tightly pressed between the pin 304 and the upper surface 10a of the main body 10, so that the chip can be immobilized in the present accommodating position. In practice, in order to prevent the pin 304 from damaging the chip by excessive extrusion, the height of the plurality of pins 304 protruding from the bottom surface 30a may be slightly smaller than the heights of the first protruding portion 300a (and the second protruding portion 300b) from the bottom surface 30a. Alternatively, the plurality of pins 304 may be, but not limited to, made of elastic material. However, although this embodiment exemplifies the chip handling module having multiple pins, but, in practice, the multiple pins might not be necessary components, and the chip handling module can still transport the chip carrier without pins, which will be implemented later.

It is worth mentioning that when the air extraction holes (222a~222d, 224a~224b and 302a~302b) are extracting air, a certain space reserved around the opening of each air extraction hole should help to suck the corresponding object tightly. In an example, the sizes of the first upper guide groove 104a and the second upper guide groove 104b shown in the figures are obviously larger than those of the vacuum guide groove 226a and the vacuum guide groove 226b. One of the reasons is that in order to reduce the volume and mass of the main body 10 and increase the thermal conductivity, the first upper guide groove 104a and the second upper guide groove 104b are larger in size, which is similar to the reason for designing the inclined surface 10c.

Figure 7:
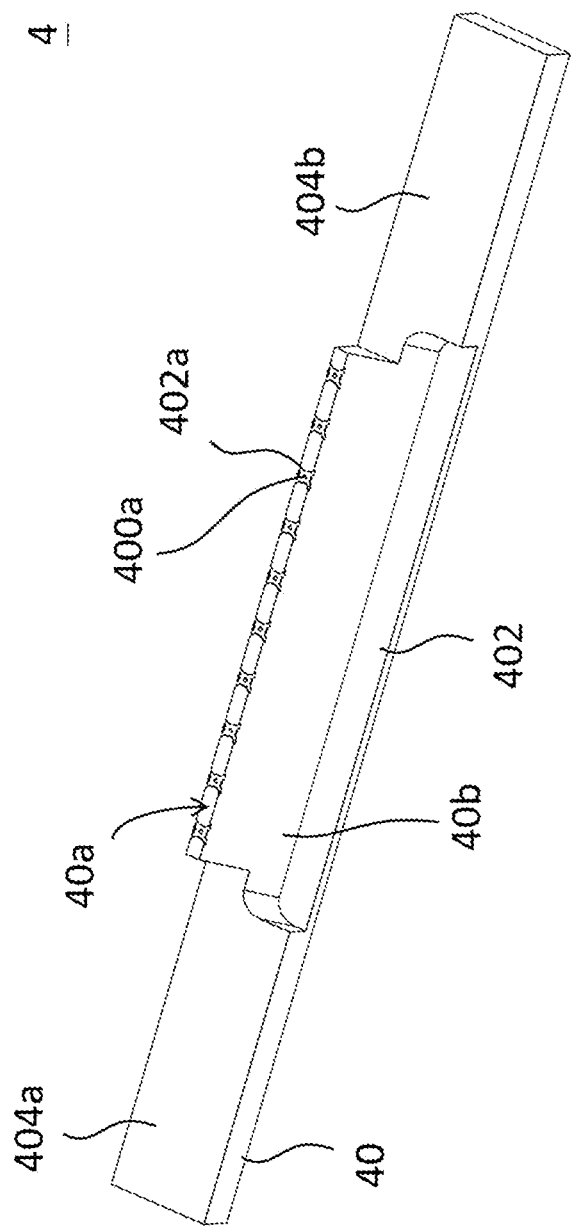
FIG. 7 is a stereoscopic diagram illustrating the chip carrier according to another embodiment of the present invention.

In another embodiment, please refer to FIG. 1 and FIG. 7 together. FIG. 7 is a stereoscopic diagram illustrating the chip carrier according to another embodiment of the present invention. As shown in figures, the present embodiment exemplifies a chip carrier 4 different from that of FIG. 1. Similar to FIG. 1, the chip carrier 4 also has a main body 40, and the main body 40 may define an upper surface 40a and a lower surface (not shown in FIG. 7). The appearance of the lower surface of the main body 40 can be the same as the lower surface of the embodiment in FIG. 1, and the lower surface structure of the main body 40 will not be described in detail in this embodiment. The appearance of the upper surface 40a is the same as the upper surface of FIG. 1, the upper surface 40a can also have the openings of a plurality of air guide holes (for example, one of the air guide holes 400a), and a certain area around the air guide hole 400a can be defined as an accommodation position 402a. However, the accommodating position 102a in FIG. 1 is directly opened on the upper surface 10a, and the accommodating position 402a is a recess, and the air guide hole 400a is arranged in the recess. In one example, the air guide hole 400a is disposed at approximately the center point of the recess, which is not limited to this embodiment.

The chip can be placed in the accommodating position 402a, but the accommodating position 402a is only used to roughly distinguish the position where the chip can be placed, which can be regarded as a very shallow imprint. In practice, in order to prevent the recess surround the accommodating position 402a from shielding the light laterally emitted from of the chip, the chip will not be completely trapped in the recess surround the accommodating position 402a, and at least a part of the chip will be exposed from the recess surround the accommodating position 402a. In other words, the depth of the recess surround the accommodating position 402a from the upper surface 40a should be less than the thickness of the chip, for example, the depth of the recess surround the accommodating position 402a from the upper surface 40a may be less than ½ of the thickness of the chip. In addition, this embodiment does not limit the shape of the recess surround the accommodating position 402a. From the top view (above top surface 40a), the recess surround the accommodating position 402a may be an X-shape, a rectangle, or other shapes that can accommodate the chip.

In addition, different from FIG. 1, the inclination of the inclined surface 40b of the chip carrier 4 is also greater than the inclination of the inclined surface 10c shown in FIG. 1, and the inclined surface 40b is connected to a platform 402. In practice, one function of the platform 402 is to increase the efficiency for controlling the temperature of the chip carrier 4 by the chip testing module 2. Person having ordinary skill in the art can understand that the platform 402 increases the area of the chip carrier 4 in contact with the chip testing module 2, and the contact area is positively related to the speed of heat conduction. That is, when the chip testing module 2 sets a temperature for testing, the chip carrier 4 placed on the chip testing module 2 can be heated (or cooled) to the specified temperature through the platform 402 more quickly. On the other hand, in order to make the chip carrier 4 easier to reach the specified temperature, the volume (or the mass) of the chip carrier 4 is further reduced in this embodiment. Compare to FIG. 1, the main body 40 are thinner than the main body 10 shown in FIG. 1, and the first upper guide groove 104a and the second upper guide groove 104b are removed. It can be seen from FIG. 4 that both ends of the main body 40 are thinner, and only have flat surfaces 404a and 404b at the two ends of the main body 40 without the upper guide grooves.

Figure 8:
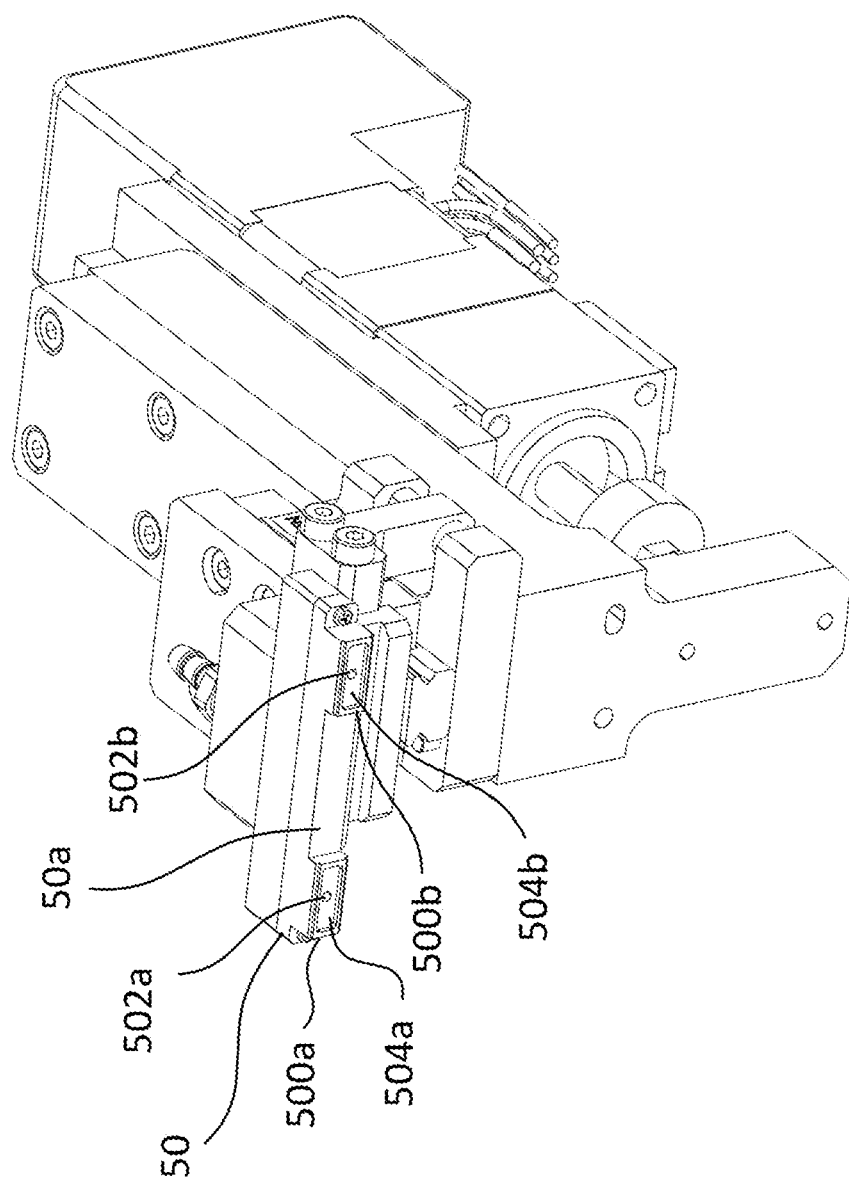
FIG. 8 is a stereoscopic diagram illustrating the chip handling module according to another embodiment of the present invention.

In an example, the surfaces 404a and 404b may be coplanar, and the surfaces 404a and 404b would be lower than the upper surface 40a, which means the surface 404a (or the surface 404b) and the upper surface 40a are not coplanar. Of course, in order to suck the chip carrier 4, the chip handling module also needs to be designed differently from that of FIG. 6. Please refer to FIG. 6, FIG. 7, and FIG. 8 together. FIG. 8 is a stereoscopic diagram illustrating the chip handling module according to another embodiment of the present invention. As shown in the figure, the same as in FIG. 6, the chip handling module 5 also has a nozzle body 50, and the nozzle body 50 may define a bottom surface 50a. A first protruding portion 500a and a second protruding portion 500b are provided on the bottom surface 50a. The first protruding portion 500a is provided with an air extraction hole 502a (third air extraction hole), and the second protruding portion 500b is provided with an air extraction hole 502b (fourth exhaust hole). In addition, the chip handling module 5 may also have a fetching equipment and an air nozzle, but since the fetching equipment and the air nozzle are not important in this embodiment, they will not be described again.

Because the structure of the chip carrier 4 to be transported is different from that of the chip carrier 1, the chip handling module 5 is also slightly different from FIG. 6. For example, the chip handling module 5 may not have pins. In practice, because the accommodating position 402a is slightly recessed from the upper surface 40a, it can help the chip to be placed properly in the accommodating position 402a. Besides, the chip itself may have residual glue that the chip can be roughly immobilized in the accommodating position 402a without displacement while transporting. In other words, the chip handling module 5 does not need the pins at the corresponding positions to press against the chip carried by the chip carrier 4. In addition, since the two ends (the plane 404a and the plane 404b) of the main body 40 of the chip carrier 4 are lower than the upper surface 40a, the first protruding portion 500a and the second protruding portion 500b should be more, compared with FIG. 6, protruded from the bottom surface 50a so that they can be attached to the positions of the flat surfaces 404a and 404b, respectively. Since the surfaces 404a and 404b no longer have upper guide grooves, in order to make the vacuum effect better, the first protrusion 500a and the second protrusion 500b may have a first suction recess 504a and a second suction recess 504b, respectively.

In the example shown in FIG. 8, the air extraction holes 502a and 502b are, respectively, in the first suction recess 504a and the second suction recess 504b. When the first protruding portion 500a and the second protruding portion 500b are attached to the surface 404a and the surface 404b, respectively, the first suction recess 504a and the surface 404a can form an air chamber (first air chamber), and the second suction recess 504b and the surface 404b can form an air chamber (second air chamber), so that a certain space can also be reserved, which should help to hold corresponding objects tightly.

To sum up, the chip carrier provided by the present invention can carry multiple chips at the same time, and the chips can be moved between various test stations by using the chip carrier, thereby improving the efficiency of transporting the chips and reducing the chance of contacting the chips directly. In addition, the chip testing module can not only fix the chip carrier, but also independently control whether to suck a specific chip on the chip carrier. The chip testing module can be electrically connected to the chip on the chip carrier, and the thermal energy of the chip carrier can be derived by using the heat conducting block. Besides, the chip handling module can suck and transport the chip carrier, and reduce the circumstances that individual chips are directly touched and moved. And, the chip handling module can use the pins to immobilize multiple chips on the chip carrier while transporting the chip carrier, thereby preventing the chips from sliding or falling.

What is claimed is:

1. A chip carrier for carrying a plurality of chips, comprising:
    a main body with an upper surface and a lower surface;
    wherein the main body has a plurality of air guide holes, and two ends of each air guide hole are respectively exposed on the upper surface and the lower surface;
    wherein a part of the air guide holes are defined as a first group, and the air guide holes of the first group are connected;
    wherein the main body is made of conductive material,
    wherein the main body has a first recess, and the first recess is used to connect with the air guide holes of the first group.

2. The chip carrier according to claim 1, wherein the first recess is exposed on the lower surface.

3. The chip carrier according to claim 2, wherein the main body has a first positioning hole and a second positioning hole, the first positioning hole and the second positioning hole are exposed on the lower surface, and the first recess is formed between the first positioning hole and the second positioning hole.

4. The chip carrier according to claim 1, wherein a plurality of accommodating positions are defined on the upper surface, each of the accommodating positions has one of the air guide holes, and each of the accommodating positions is corresponded to one of the chips.

5. The chip carrier according to claim 4, wherein when one of the accommodating positions accommodates the corresponding chip, the chip covers the air guide hole within the accommodating position.

6. The chip carrier according to claim 4, wherein the main body is provided with a first upper guide groove and a second upper guide groove, the first upper guide groove and the second upper guide groove are exposed on the upper surface, and the accommodating positions are located between the first upper guide groove and the second upper guide groove.

7. The chip carrier according to claim 4, wherein each of the accommodating positions is a recess, and the recess encircles one of the air guide holes.

* * * * *